(12) United States Patent
Honda

(10) Patent No.: US 7,193,476 B2
(45) Date of Patent: Mar. 20, 2007

(54) INTEGRATED CIRCUIT

(75) Inventor: Takanori Honda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 56 days.

(21) Appl. No.: 10/963,558

(22) Filed: Oct. 14, 2004

(65) Prior Publication Data

US 2005/0083135 A1   Apr. 21, 2005

(30) Foreign Application Priority Data

Oct. 15, 2003   (JP) .............................. 2003-354606

(51) Int. Cl.
*H03F 3/04* (2006.01)

(52) U.S. Cl. ...................... 330/302; 330/278; 330/296; 330/310

(58) Field of Classification Search ................ 330/302, 330/278, 296, 310
See application file for complete search history.

(56) References Cited

U.S. PATENT DOCUMENTS

| 5,977,823 A | * | 11/1999 | Inoue et al. ................... 330/2 |
| 5,982,236 A | * | 11/1999 | Ishikawa et al. ............. 330/296 |
| 6,064,265 A | * | 5/2000 | Yun et al. ..................... 330/279 |
| 6,580,321 B1 | * | 6/2003 | Arell et al. ............... 330/207 P |
| 6,586,993 B2 | * | 7/2003 | Macedo ........................ 330/51 |
| 6,731,175 B1 | * | 5/2004 | Chen .......................... 330/311 |
| 6,762,647 B1 | * | 7/2004 | Apel ........................... 330/279 |
| 6,919,761 B2 | * | 7/2005 | Cho et al. ...................... 330/51 |
| 6,933,779 B2 | * | 8/2005 | Lee et al. ...................... 330/51 |
| 6,972,628 B2 | * | 12/2005 | Eo et al. ...................... 330/285 |

FOREIGN PATENT DOCUMENTS

| JP | 58-051609 | 3/1983 |
| JP | 07-202613 | 8/1995 |

* cited by examiner

*Primary Examiner*—Patricia Nguyen
(74) *Attorney, Agent, or Firm*—Foley & Lardner LLP

(57) ABSTRACT

An integrated circuit includes a high-frequency power amplifier and a matching circuit. The high-frequency power amplifier has at least one stage of an amplifier element. The matching circuit has a MOSFET and a detector diode. The source of the MOSFET is connected to an input of a first stage amplifier element, the drain is connected to a ground, and the gate is also connected to the ground. A capacitor is connected between the gate of the MOSFET and the ground. The detector diode is connected in parallel between the drain and the gate of the MOSFET. Turning on the MOSFET reduces the effective gain of the first stage amplifier element, thereby allowing mode change.

19 Claims, 4 Drawing Sheets

INTEGRATED CIRCUIT

BACKGROUND OF THE INVENTION

1. Field of the Invention

The present invention relates to integrated circuits, and particularly, to a transmission power amplifier suitable for use in a mobile phone having a switch circuit for switching operation mode and built with a multi-chip module (MCM) technology.

2. Description of Related Art

As mobile phones become more and more functional, the amount of information transmission is ever increasing, starting with mere voice communication to internet connection and image transmission. Thus, a variety of digital modulation techniques capable of high-speed, large capacity transmission are used in wireless transfer. A transmission power amplifier used in a mobile phone and so on using the digital modulation technique is required to have a low error rate in digital data and high power efficiency. To meet both requirements, some mobile phones employ both of a Enhanced Data GSM Environment (EDGE) system for linear operation with a low digital data error rate and a Global System for Mobile communication (GSM) system for operation with high power efficiency. Such mobile phones have a control terminal for switching the EDGE system and the GSM system to switch load resistance of the amplifier, thereby changing power efficiency. Further, the power amplifier is packaged in MCM where a matching circuit constituted by an active element having a heterojunction bipolar transistor (HBT) structure and a passive element switching the functions of the active element are formed on a principal surface of a semi-insulating compound semiconductor substrate. Thus, higher function, smaller-size, and lower-cost products progressively come into practical use in a several GHz range.

The operation of a conventional transmission power amplifier for a mobile phone is explained below with reference to FIG. 4. FIG. 4 is a circuit diagram to explain an example of a conventional transmission power amplifier used in a mobile phone and so on. The transmission power amplifier of FIG. 4 is a three-stage power amplifier composed of three HBTs Q1, Q2, and Q3. This circuit switches between high power efficiency operation mode (GSM) and linear operation mode (EDGE) by a V-mode terminal voltage. Generally, the linear operation mode performs backoff to a power level of 10 to 15 dB lower from the saturation state of the amplifier. As shown in FIG. 4, a first stage amplifier HBT Q1, a second stage amplifier HBT Q2, and a final stage amplifier HBT Q3 are configured as a grounded emitter amplifier circuit in which input or collector output of the previous stage is inputted to its base. The base of the HBT Q1 is connected to an input terminal IN, through which an RF signal is inputted. The collector of the HBT Q3 is connected to an output terminal OUT. Capacitors C1, C2, C3, and C4 for direct current cutting are connected in series between the input terminal IN, the HBTs Q1, Q2, Q3, and the output terminal OUT, respectively. Bias voltages Vb1, Vb2, Vb3, Vcc1, Vcc2, and Vcc3 are supplied to the base and collector of the HBTs Q1, Q2, and Q3, respectively.

The circuit of FIG. 4 also includes a matching circuit for switching the GSM mode and the EDGE mode. The matching circuit is constituted by connecting a diode D1 to the base of the first stage amplifier HBT Q1 and to the base of the second stage amplifier HBT Q2 via a capacitor C5 and a capacitor C6, respectively, connected in series, and connecting a resistor R3 in parallel with the cathode terminal of the diode D1. Further, a V-mode terminal C-IN is connected the anode of the diode D1 so as to turn on or off the diode D1 by the voltage inputted to the V-mode terminal C-IN, thereby switching the GSM mode and the EDGE mode.

In the transmission power amplifier with the above matching circuit connected thereto, when setting the EDGE mode, if a voltage higher than a forward voltage of the diode D1 is inputted to the V-mode terminal C-IN to turn on the diode D1, the RF signal from the input terminal IN is attenuated through the diode D1 and the resistor R3, decreasing the effective gain of the first stage amplifier HBT Q1. On the other hand, if a voltage lower than the forward voltage of the diode D1 is inputted to the V-mode terminal C-IN to turn off the diode D1, the RF signal does not pass through the diode D1, thereby increasing the effective gain of the first stage amplifier HBT Q1. Japanese Unexamined Patent Application Publication No. 07-202613, for example, describes the circuit which has the control terminal C-IN in addition to the input terminal IN so as to adjust the gain. Japanese Unexamined Patent Application Publication No. 58-051609 describes another circuit which automatically controls the gain.

It has now been discovered that current consumption increases in the conventional power amplifier shown in FIG. 4 since it requires a current flow path from the V-mode terminal C-IN for mode switching control to the resistor R3 through the diode D1. Further, power efficiency decreases since the gain of the first stage amplifier HBT Q1 decreases as the RF signal from the input terminal IN is attenuated. Furthermore, the circuit of FIG. 4 and the circuits described in Japanese Unexamined Patent Application Publications No. 07-202613 and 58-051609 require an additional terminal to control gain and a circuit to generate a V-mode voltage in addition to the power amplifier circuit. This complicates the circuit for the baseband control of a mobile phone set.

SUMMARY OF THE INVENTION

According to one aspect of the present invention, there is provided an integrated circuit including a high-frequency power amplifier having at least one stage of an amplifier element, which comprises a matching circuit. The matching circuit includes a metal oxide semiconductor field effect transistor (MOSFET) with a source connected to an input of the amplifier element, a drain connected to a ground, and a gate connected to the ground; a capacitor connected between the gate of the MOSFET and the ground; and a detector diode connected in parallel between the drain and the gate of the MOSFET.

According to another aspect of the present invention, there is provided an integrated circuit including a high-frequency power amplifier having at least two stages of amplifier elements, which comprises a matching circuit. The matching circuit comprises a metal oxide semiconductor field effect transistor (MOSFET) with a source connected to an output of a previous-stage amplifier element, a drain connected to a ground, and a gate connected to the ground; a capacitor connected between the gate of the MOSFET and the ground; and a detector diode connected in parallel between the drain and the gate of the MOSFET.

According to still another aspect of the present invention, there is provided an integrated circuit including a high-frequency power amplifier including at least one stage of an amplifier element and a matching circuit connected to an input of the amplifier element, in which the matching circuit controls gain of the amplifier element in accordance with a signal level at the input of the amplifier element.

The present invention switches the on and off of the MOSFET according to the RF signal inputted to the high-frequency power amplifier to control the signal level inputted to the amplifier element. It is thereby possible to control the effective gain of the power amplifier based on the level of the RF signal output, allowing mode switching between GSM mode and EDGE mode, for example, without use of an additional control terminal and a circuit for generating a control voltage.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A matching circuit of the present invention preferably includes a first resistor connected between the drain of a metal oxide semiconductor field effect transistor (MOSFET) and ground, and a second resistor connected in parallel with a capacitor. The MOSFET of the present invention is preferably a P-channel MOSFET. Further, a high-frequency power amplifier of the present invention is preferably a transmission power amplifier of a mobile phone capable of switching between EDGE system operation and GSM system operation. Furthermore, the high-frequency power amplifier is preferably packaged in multi-chip module (MCM).

Figure 1:
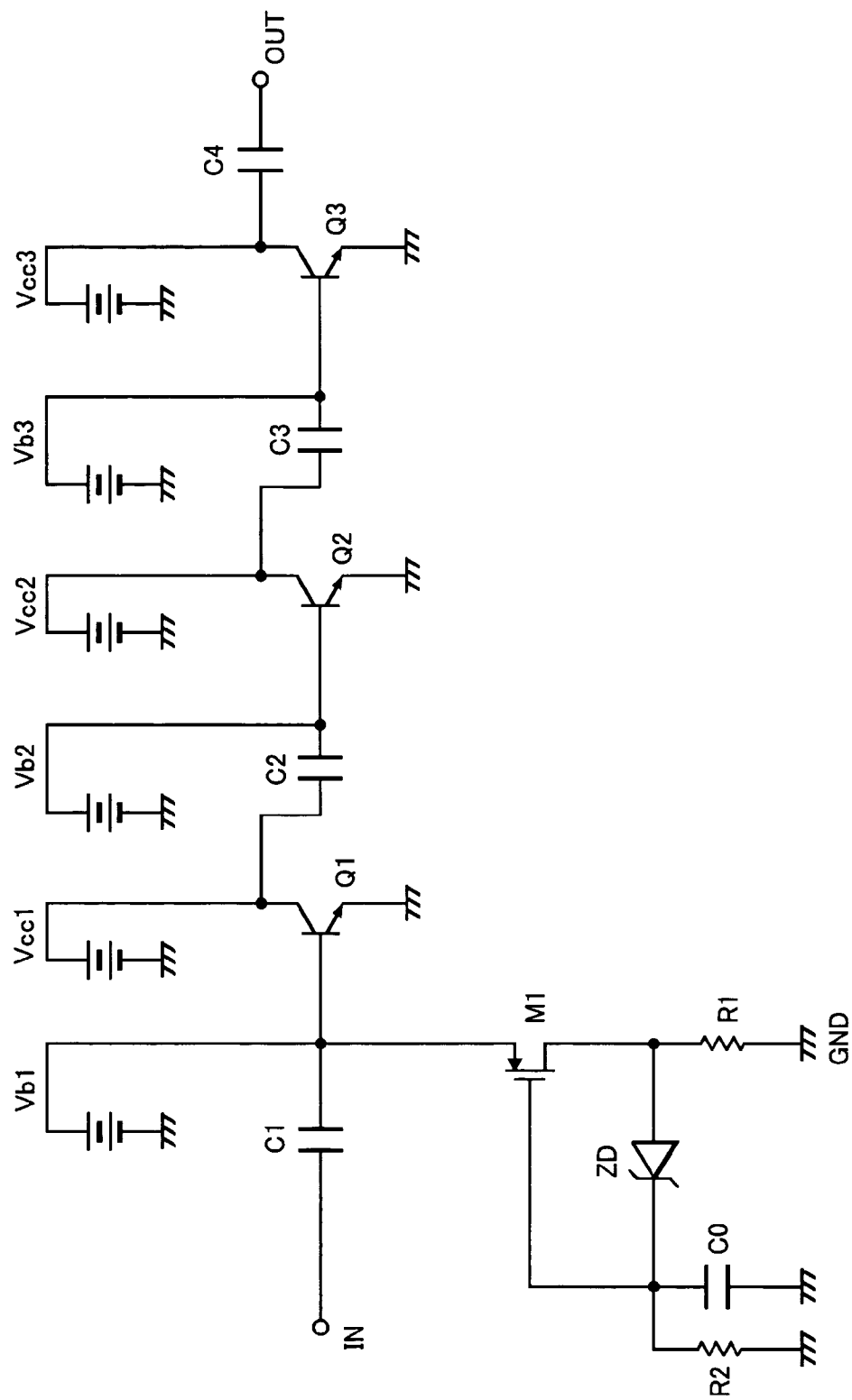
FIG. 1 is an equivalent circuit diagram of a first embodiment of the invention.
Figure 4:
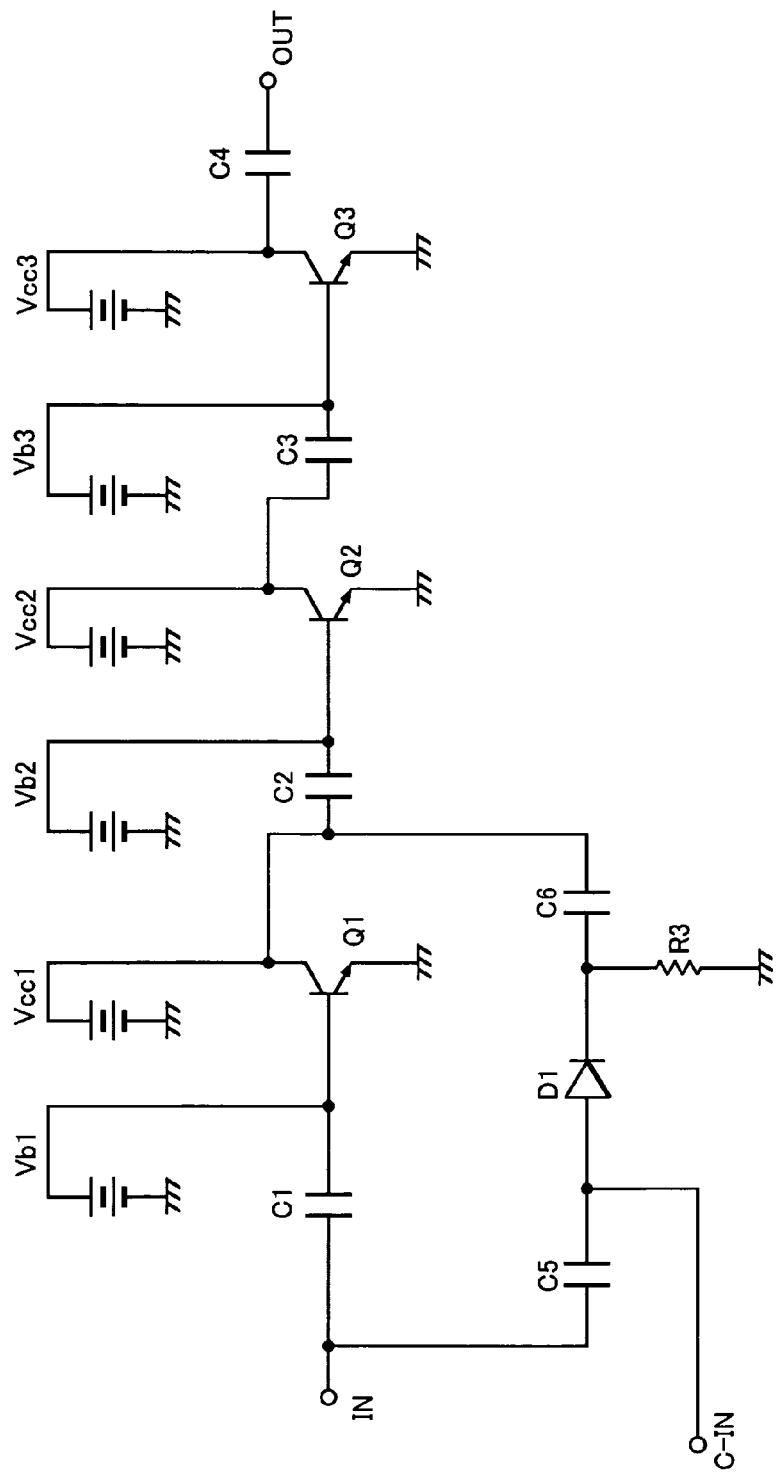
FIG. 4 is an equivalent circuit diagram of an example of a conventional power amplifier.

The first embodiment of the present invention is explained hereinafter with reference to the drawings. FIG. 1 is a circuit diagram showing the first embodiment of the invention. The structure of the power amplifier is the same as that of the conventional circuit shown in FIG. 4, which is a three-stage power amplifier composed of a first stage amplifier HBT Q1, a second stage amplifier HBT Q2, and a final stage amplifier HBT Q3. Each HBT is configured as a grounded emitter amplifier circuit in which input or collector output of the previous stage is inputted to its base. The base of the HBT Q1 is connected to an input terminal IN, through which an RF signal is inputted. The collector of the HBT Q3 is connected to an output terminal OUT. Capacitors C1, C2, C3, and C4 for direct current cutting are connected in series between the input terminal IN, the HBTs Q1, Q2, Q3, and the output terminal OUT, respectively. Bias voltages Vb1, Vb2, Vb3, Vcc1, Vcc2, and Vcc3 are supplied to the base and collector of the HBTs Q1, Q2, and Q3, respectively.

The circuit of FIG. 1 also includes a matching circuit for switching the EDGE mode and the GSM mode. In the matching circuit, the source of a P-channel MOSFET (PMOSFET) M1 is connected to the base of the first stage amplifier HBT Q1, and the drain of the PMOSFET M1 is connected to the ground GND via a first resistor R1 with resistance of 50 Ω, for example. Further, a detector diode ZD, which is, for example, a Schottky diode, is connected between the gate and drain of the PMOSFET M1. The cathode of the detector diode ZD is connected to the gate of the PMOSFET M1, and the anode of the ZD is connected to the drain of the M1. The cathode of the detector diode ZD is also connected to the ground GND via a second resistor R2 with resistance of 5 Ω, for example, and a capacitor C0 with capacitance of 1 nF, which is connected in parallel with the second resistor R2.

Figure 2:
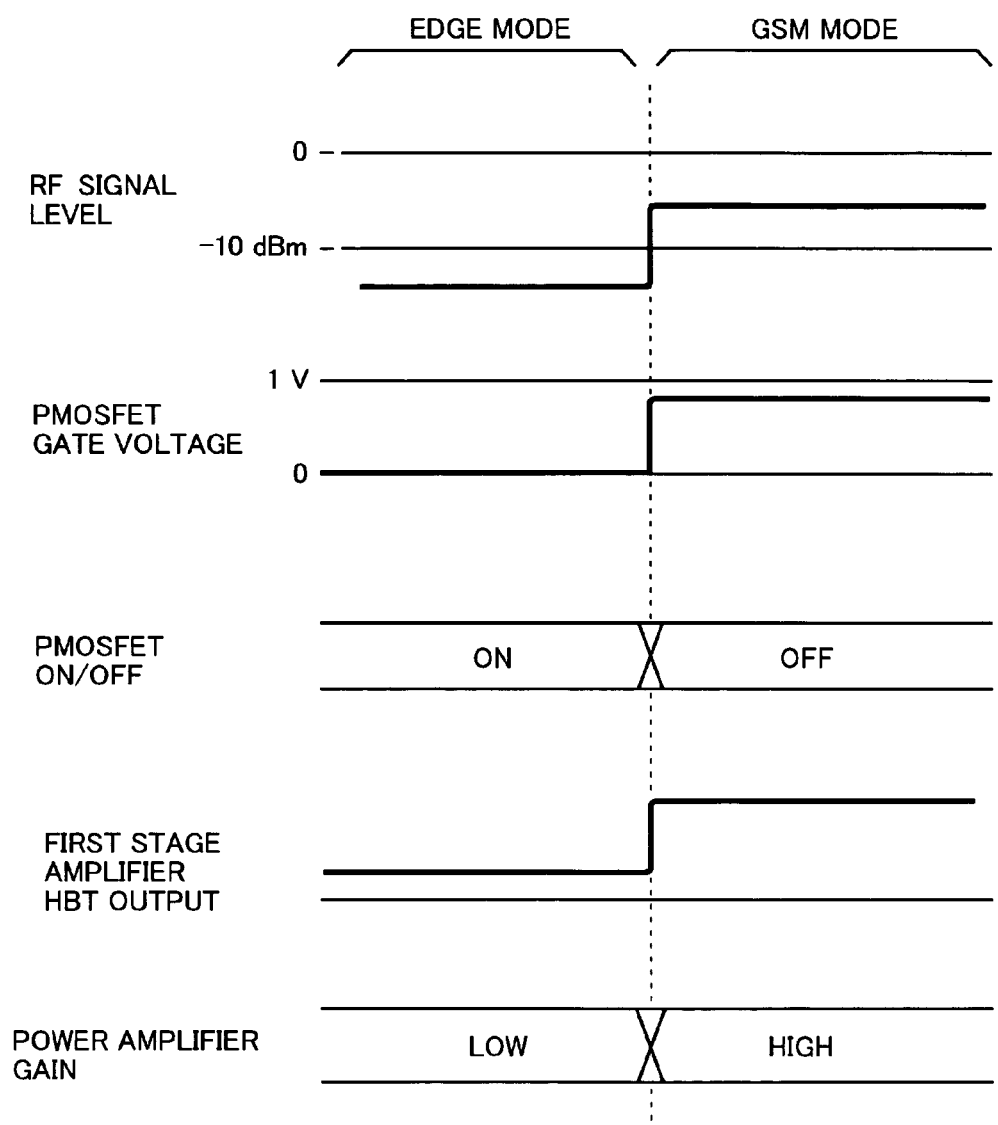
FIG. 2 is a timing chart to explain the circuit operation of the first embodiment.

The operation of the matching circuit is explained with reference to the timing chart of FIG. 2. A voltage of 0 V is applied to the gate terminal of the PMOSFET M1, and a base bias voltage of 1.3 V of the first stage amplifier HBT Q1 is applied to the source terminal of the PMOSFET M1. If the mobile phone operates in the EDGE mode, the RF signal from the input terminal IN falls below a predetermined level (for example, −10 dBm). The output voltage of the detector diode ZD thus does not reach a turn-off voltage of the PMOSFET M1, which is, for example, 0.9 V. The PMOSFET M1 is thereby turned on. The RF signal from the input terminal IN therefore passes through the source and drain of the PMOSFET M1 and the first resistor R1 to flow into the ground GND. A signal lower than the RF signal from the input terminal IN is thereby inputted to the base of the first stage amplifier HBT Q1, which decreases the effective gain of the first stage amplifier HBT Q1. This results in decrease in the overall gain of the power amplifier.

If, on the other hand, the mobile phone operates in the GSM mode, the RF signal from the input terminal IN exceeds the predetermined level (in this case, −10 dBm). This signal passes through the source and drain of the PMOSFET M1 and flows into the detector diode ZD. The voltage of the detector diode ZD thereby reaches the turn-off voltage of the PMOSFET M1 which is, for example, 0.9 V. This voltage is then inputted to the gate of the PMOSFET M1 to turn it off. The RF signal from the input terminal IN is therefore inputted to the base of the first stage amplifier HBT Q1 without through the source and drain of the PMOSFET M1, thus not attenuated by the first resistor R1. This increases the output of the first stage amplifier HBT Q1, resulting in increase in the overall gain of the power amplifier.

In the GSM mode, the input of the RF signal to the detector diode ZD stops if the PMOSFET M1 is turned off. The PMOSFET M1 remains off by the voltage stored in the capacitor C0 connected to the output of the detector diode ZD. Even if the PMOSFET M1 is turned on due to decrease in the voltage of the capacitor C0, since the output of the detector diode ZD is equal to or higher than the turn-off voltage of the PMOSFET M1 when the inputted RF signal is equal to or higher than a predetermined level, the PMOSFET M1 is immediately turned off. Consequently, the PMOSFET M1 is kept off after all. When the inputted RF signal is lower than the predetermined level, the PMOSFET M1 is kept on after the PMOSFET M1 is turned on.

In this way, the matching circuit automatically switches the on and off of the PMOSFET M1 in accordance with the level of the RF signal inputted to the input terminal IN. If the input level of the RF signal is low in the EDGE mode, the PMOSFET M1 is turned on to decrease the gain of the first stage amplifier HBT Q1. If, on the other hand, the input level of the RF signal is high in the GSM mode, the PMOSFET M1 is turned off to increase the gain of the first stage amplifier HBT Q1. This eliminates the need for a V-mode terminal to control gain and a circuit to generate a V-mode voltage, which are necessary in the conventional circuit of FIG. 4. It is thereby possible to simplify the structure of the power amplifier.

Figure 3:
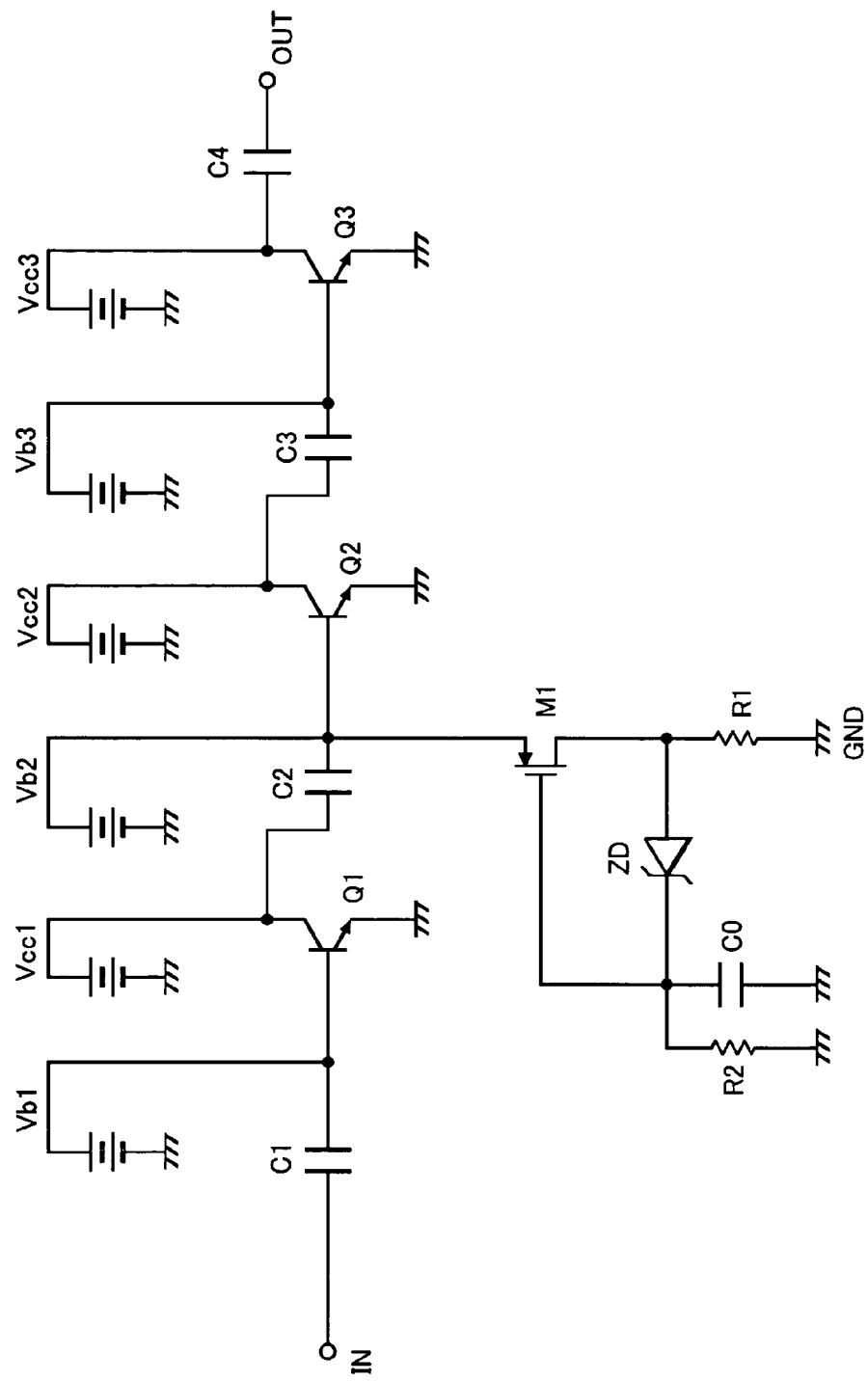
FIG. 3 is an equivalent circuit diagram of a second embodiment of the invention.

The second embodiment of the present invention is described hereinafter. FIG. 3 is an equivalent circuit diagram of the second embodiment. This embodiment places the matching circuit in such a way that it serves as an interstage matching circuit in a three-stage power amplifier, which is the same as that of the first embodiment. In FIG. 3, the same elements as in FIG. 1 are denoted by the same reference symbols. The three-stage power amplifier is composed of the first stage amplifier HBT Q1, the second stage amplifier HBT Q2, and the final stage amplifier HBT Q3. If, in this three-stage power amplifier, the output RF signal from the input terminal IN is too large when the base voltage of the first stage amplifier HBT Q1 is 0 V, the RF signal can leak into the collector of the first stage amplifier HBT Q1. In this case, this leak signal is then amplified by the second stage amplifier HBT Q2 and so on, which can fail to meet the isolation specification of the power amplifier.

To overcome this, the second embodiment connects a matching circuit having the same structure as that of the first embodiment between the first stage amplifier HBT Q1 and the second stage amplifier HBT Q2. The source of the PMOSFET M1 is connected to the base of the second stage amplifier HBT Q2, and the drain of the PMOSFET M1 is connected to the ground GND via the the first resistor R1. Further, the detector diode ZD is connected between the gate and drain of the PMOSFET M1. The cathode of the ZD is connected to the gate of the M1, and the anode of the ZD is connected to the drain of the M1. The cathode of the detector diode ZD is also connected to the ground GND via the second resistor R2 and the capacitor C0 connected in parallel.

In this matching circuit, the on and off of the PMOSFET M1 is switched by the level inputted to the source of the PMOSFET M1, as is the case with the first embodiment. In this embodiment, however, the source of the PMOSFET M1 receives the collector output of the first stage amplifier HBT Q1. Thus, in the case where the RF signal leaks into the collector of the first stage amplifier HBT Q1, this leak signal level turns on the PMOSFET M1. The leak signal thus passes through the source and drain of the PMOSFET M1 and the first resistor R1, and flows into the ground GND. Hence, the RF signal is substantially not inputted to the base of the second stage amplifier HBT Q2, which allows meeting the isolation specification.

As described above, the second embodiment can eliminate the need for a terminal to obtain isolation to meet the isolation specification and a circuit to generate a voltage to be supplied to the terminal in the matching circuit. It is thereby possible to simplify the circuit structure.

Though the first and second embodiments describe the case where the present invention is applied to a three stage power amplifier, the first embodiment may be applied to at least one stage power amplifier, and the second embodiment may be applied to at least two stage power amplifier. Further, if the HBT, which serves as an amplifier element, is a PNP transistor, the PMOSFET constituting the matching circuit may be replaced by N-channel MOS in theory.

It is apparent that the present invention is not limited to the above embodiment that may be modified and changed without departing from the scope and spirit of the invention.

What is claimed is:

1. An integrated circuit including a high-frequency power amplifier including at least one stage of an amplifier element, comprising:
    a matching circuit, the matching circuit comprising:
    a metal oxide semiconductor field effect transistor (MOSFET) with a source connected to an input of the amplifier element, a drain connected to a ground, and a gate connected to the ground;
    a capacitor connected between the gate of the MOSFET and the ground; and
    a detector diode connected in parallel between the drain and the gate of the MOSFET.

2. The integrated circuit according to claim 1, wherein the MOSFET is a P-channel MOSFET.

3. The integrated circuit according to claim 1, further comprising:
    a first resistor connected between the drain of the MOSFET and the ground; and
    a second resistor connected in parallel with the capacitor.

4. The integrated circuit according to claim 1, wherein an anode of the detector diode is connected to the drain of the MOSFET, and a cathode of the detector diode is connected to the gate of the MOSFET.

5. The integrated circuit according to claim 1, wherein the high-frequency power amplifier is used in a mobile phone capable of switching a first mode and a second mode providing higher gain than the first mode.

6. The integrated circuit according to claim 5, wherein the first mode is an Enhanced Data GSM Environment (EDGE) mode, and the second mode is a Global System for Mobile (OSM) mode.

7. The integrated circuit according to claim 1, wherein the high-frequency power amplifier is packaged in a multi-chip module.

8. An integrated circuit including a high-frequency power amplifier including at least two stages of amplifier elements, comprising:
    a matching circuit, the matching circuit comprising:
    a metal oxide semiconductor field effect transistor (MOSFET) with a source connected to an output of a previous-stage amplifier element, a drain connected to a ground, and a gate connected to the ground;
    a capacitor connected between the gate of the MOSFET and the ground; and
    a detector diode connected in parallel between the drain and the gate of the MOSFET.

9. The integrated circuit according to claim 8, wherein the MOSFET is a P-channel MOSFET.

10. The integrated circuit according to claim 8, further comprising:
    a first resistor connected between the drain of the MOSFET and the ground; and
    a second resistor connected in parallel with the capacitor.

11. The integrated circuit according to claim 8, wherein an anode of the detector diode is connected to the drain of the MOSFET, and a cathode of the detector diode is connected to the gate of the MOSFET.

12. The integrated circuit according to claim 8, wherein the high-frequency power amplifier is used in a mobile phone capable of switching a first mode and a second mode providing higher gain than the first mode.

13. The integrated circuit according to claim 12, wherein the first mode is an Enhanced Data GSM Environment (EDGE) mode, and the second mode is a Global System for Mobile (GSM) mode.

14. The integrated circuit according to claim 8, wherein the high-frequency power amplifier is packaged in a multi-chip module.

15. An integrated circuit including:
 a high-frequency power amplifier including at least one stage of an amplifier element and a matching circuit connected to an input of the amplifier element,
 said matching circuit connected to receive an input RF signal, wherein the matching circuit controls attenuation of said received input RF signal in response to a signal level of the input RF signal and feeds same to input of the amplifier element; and
 wherein said matching element includes:
 a detector element detecting if an RF signal at the input end or the output end of the amplifier element exceeds a predetermined level, and
 an element switched on or off by the detector element.

16. The integrated circuit according to claim 15, wherein the matching circuit attenuates said received input RF signal at a first level if the signal level of the input RF signal is lower than a predetermined value, and attenuates the received RF signal at a second level if the signal level of the input RF signal is equal to or higher than the predetermined value.

17. An integrated circuit including a high-frequency power amplifier including at least one stage of an amplifier element, comprising:
 a matching circuit connected to an input end or an output end of the amplifier element, the matching circuit comprising
 a detector element detecting if an RF signal at the input end or the output end of the amplifier element exceeds a predetermined level, and
 an element switched on or off by the detector element.

18. The integrated circuit as recited in claim 17 wherein when said element is switched on, said integrated circuit is operative for feeding an input signal to said at least one stage for amplifying said input signal at a first gain when the input signal is below a predetermined level sufficient to place said element in one of an on or off state, and said integrated circuit is operative for feeding said input signal to said at least one stage for amplifying said input signal at a second gain when the input signal is equal to or above said predetermined level sufficient to place said element in the other of said on or off state.

19. The integrated circuit as recited in claim 15 wherein said first level is positive and corresponds to attenuating said received input RF signal, and said second level is zero and corresponds to not attenuating said received input RF signal.

* * * * *